US012805062B2

(12) United States Patent
Hu

(10) Patent No.: US 12,805,062 B2
(45) Date of Patent: Nov. 17, 2026

(54) SOLAR ENERGY UTILIZATION UNIT AND COMBINED STRUCTURE THEREFOR

(71) Applicants: BOLYMEDIA HOLDINGS CO. LTD., Santa Clara, CA (US); Xiaoping Hu, Shenzhen (CN)

(72) Inventor: Xiaoping Hu, Shenzhen (CN)

(73) Assignees: BOLYMEDIA HOLDINGS CO. LTD., Santa Clara, CA (US); Xiaoping Hu, Shenzhen (CN)

( * ) Notice: Subject to any disclaimer, the term of this patent is extended or adjusted under 35 U.S.C. 154(b) by 197 days.

(21) Appl. No.: 18/564,607

(22) PCT Filed: May 31, 2021

(86) PCT No.: PCT/CN2021/097106

§ 371 (c)(1),
(2) Date: Nov. 27, 2023

(87) PCT Pub. No.: WO2022/251992

PCT Pub. Date: Dec. 8, 2022

(65) Prior Publication Data

US 2024/0379888 A1 Nov. 14, 2024

(51) Int. Cl.
*H10F 77/42* (2025.01)
*H10F 77/67* (2025.01)

(52) U.S. Cl.
CPC ......... *H10F 77/488* (2025.01); *H10F 77/484* (2025.01); *H10F 77/67* (2025.01)

(58) Field of Classification Search
CPC ...... H10F 77/488; H10F 77/484; H10F 77/67; H10F 77/63; F24S 23/82; F24S 80/50; F24S 2023/876; F24S 23/30; F24S 23/70; H02S 40/44; H02S 40/22
See application file for complete search history.

(56) References Cited

U.S. PATENT DOCUMENTS

2008/0190415 A1* 8/2008 Pei .......................... G02B 3/12
126/698
2010/0269886 A1* 10/2010 Argentar .............. H10F 77/484
136/246

FOREIGN PATENT DOCUMENTS

CN 213072566 U 4/2021
WO 2020154963 A1 8/2020

OTHER PUBLICATIONS

International Search Report of PCT Patent Application No. PCT/CN2021/097106 issued on Feb. 24, 2022.

* cited by examiner

*Primary Examiner* — Angelo Trivisonno

(57) ABSTRACT

Disclosed is a solar energy utilization unit and a combined structure thereof. The solar energy utilization unit comprises a light energy utilization means, a convex liquid light-concentrating means, a first reflection formation and a second reflection formation. The first reflection formation can reflect sunlight to the convex liquid light-concentrating means. The sunlight emitted, in the convex liquid light-concentrating means, from a transparent liquid to a transparent convex sidewall produces the phenomenon of total reflection, such that more sunlight can be concentrated onto the first light energy utilization part of the light energy utilization means.

16 Claims, 2 Drawing Sheets

SOLAR ENERGY UTILIZATION UNIT AND COMBINED STRUCTURE THEREFOR

TECHNICAL FIELD

The present disclosure relates to structures for the conversion and utilization of light energy.

BACKGROUND

Solar energy utilization devices are used for the recycling of solar energy, such as solar power generation through photovoltaic panels. With the decrease in cost and increase in efficiency of photovoltaic panels, solar energy utilization devices have been increasingly applied. However, the current low-power concentrating solar device can further improve the concentrating efficiency of solar energy.

SUMMARY

A new type of solar energy utilization unit and a combined structure therefor provided in the present disclosure to demonstrate a new solar energy utilization structure.

Aiming to the above objects, a solar energy utilization unit provided in an embodiment of the present disclosure may include:

- a light energy utilization means having a first light energy utilization part and a second light energy utilization part that are arranged oppositely and are capable of receiving, converting and utilizing sunlight;
- a convex liquid light-concentrating means having a holding cavity filled with a transparent liquid, the holding cavity being provided with a sloped transparent convex sidewall capable of transmitting the sunlight therethrough to the transparent liquid, the light energy utilization means being arranged inside the holding cavity, or outside the holding cavity or formed as a wall of the holding cavity, the first light energy utilization part being faced towards the convex liquid light-concentrating means or the transparent liquid, the holding cavity being formed as a structure capable of allowing at least part of the sunlight emitted from the transparent liquid to the transparent convex sidewall to produce a phenomenon of total reflection, so as to concentrate the sunlight onto the first light energy utilization part;
- a first reflection formation arranged on an outer side of the convex liquid light-concentrating means capable of reflecting sunlight to the convex liquid light-concentrating means, the first reflection formation being provided with a first light inlet for sunlight to access; and
- a second reflection formation arranged on an outer side of the first reflection formation, a light reflection cavity being formed among the first reflection formation, the second light energy utilization part and the second reflection formation, the light reflection cavity being provided with a second light inlet for sunlight to enter the light reflection cavity, and the second reflection formation reflecting sunlight entered into the light reflection cavity onto the second light energy utilization part.

In an embodiment, a clearance is left between the first reflection formation and the second reflection formation, and the clearance forms the second light inlet.

In an embodiment, the second reflection formation is a groove-like structure in which the light energy utilization means, the convex liquid light-concentrating means and the first reflection formation are arranged, and the groove-like structure has an internal reflecting surface to reflect sunlight onto the second light energy utilization part.

In an embodiment, a sidewall of the groove-like structure overlaps with the first reflection formation, and another sidewall of the groove-like structure is separated from the first reflection formation.

In an embodiment, both sidewalls of the groove-like structure are separated from the first reflection formation.

In an embodiment, the unit may further comprise a second convex liquid light-concentrating means arranged in the light reflection cavity and having a second holding cavity filled with a transparent liquid, wherein the second holding cavity has a second transparent convex sidewall in a downward sloped convex arrangement, the sunlight entering the light reflection cavity is allowed to be emitted from the transparent convex sidewall to the transparent liquid; the light energy utilization means is arranged inside the second holding cavity, outside the second holding cavity or forms a wall of the second holding cavity, the second light energy utilization part is faced towards the second convex liquid light-concentrating means or the transparent liquid in the second holding cavity, and the second holding cavity is formed as a structure capable of allowing at least part of the sunlight emitted from the transparent liquid therein to the second transparent convex sidewall to produce a phenomenon of total reflection, mirror reflection or diffuse reflection, so as to concentrate the sunlight onto the second light energy utilization part.

In an embodiment, the convex liquid light-concentrating means is arranged upward in a sharp and protruding manner, and the second convex liquid light-concentrating means is arranged downward in a sharp and protruding manner.

In an embodiment, the vertical cross-section of the convex liquid light-concentrating means is triangular, and the vertical cross-section of the second convex liquid light-concentrating means is inverted triangular.

In an embodiment, the bottom of the second reflection formation is connected to a sharp and protruding portion of the second convex liquid light-concentrating means to divide the light reflection cavity into at least two parts.

In an embodiment, the second convex liquid light-concentrating means is arranged beneath the second light energy utilization part.

In an embodiment, the first reflection formation has at least two reflectors distributed on both sides of the convex liquid light-concentrating means, wherein one side of each reflector facing the convex liquid light-concentrating means is provided with a reflective surface, or both sides of each reflector are provided with reflective surfaces.

In an embodiment, the reflectors are symmetrically arranged on both sides of the convex liquid light-concentrating means.

In an embodiment, the unit may further comprise a transparent cover plate enclosing the first reflection formation and the second reflection formation.

In an embodiment, the light energy utilization means, the convex liquid light-concentrating means, the first reflection formation and the second reflection formation are extended in a same direction to form a strip-like structure.

Aiming to the above objects, a combined structure for solar energy utilization units provided in an embodiment of the present disclosure may comprise at least two solar energy utilization units according to any of the embodiments mentioned above arranged side by side, wherein a cavity provided with a thermal utilization working medium, a charging battery, and/or a control circuit board therein is formed between adjacent solar energy utilization units.

In an embodiment, the cavity is divided by an isolation wall into a first cavity filled with the thermal utilization working medium and a second cavity in which the charging battery and the control circuit board are arranged.

According to the solar energy utilization unit comprising the light energy utilization means, the convex liquid light-concentrating means, the first reflection formation and the second reflection formation in any of the embodiments mentioned above, the first reflection formation can reflect sunlight onto the convex liquid light-concentrating means, the convex liquid light-concentrating means allows the sunlight emitted from the transparent liquid to the transparent convex sidewall therein to produce the phenomenon of total reflection so as to allowing more sunlight to be concentrated onto the first light energy utilization part of the light energy utilization means, the second reflection formation and the first reflection formation forms the light reflection cavity capable of reflecting sunlight beyond the light-receiving range of the first reflection formation and the convex liquid light-concentrating means onto the second light energy utilization part of the light energy utilization means, thereby improving light-concentrating efficiency of the light energy utilization means.

DETAILED DESCRIPTION

Figure 1:
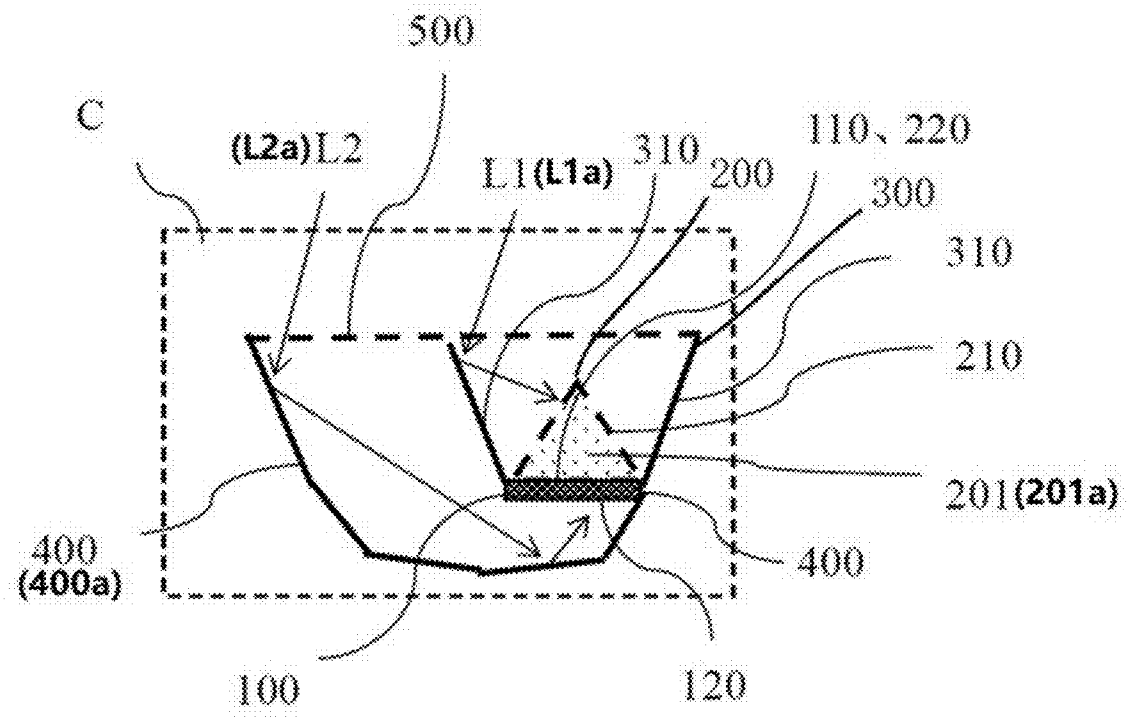
FIG. 1 is a schematic diagram of the vertical cross-section of a solar energy utilization unit in an embodiment of the present disclosure.

The present disclosure will be further described in detail below through specific embodiments with reference to the accompanying drawings. Common or similar elements are referenced with like or identical reference numerals in different embodiments. Many details described in the following embodiments are for better understanding the present disclosure. However, those skilled in the art can realize with minimal effort that some of these features can be omitted in different cases or be replaced by other elements, materials and methods. For clarity some operations related to the present disclosure are not shown or illustrated herein so as to prevent the core from being overwhelmed by excessive descriptions. For those skilled in the art, such operations are not necessary to be explained in detail, and they can fully understand the related operations according to the description in the specification and the general technical knowledge in the art.

In addition, the features, operations or characteristics described in the specification may be combined in any suitable manner to form various embodiments. At the same time, the steps or actions in the described method can also be sequentially changed or adjusted in a manner that can be apparent to those skilled in the art. Therefore, the various sequences in the specification and the drawings are only for the purpose of describing a particular embodiment, and are not intended to be an order of necessity, unless otherwise stated one of the sequences must be followed.

The serial numbers of components herein, such as “first”, “second”, etc., are only used to distinguish the described objects and do not have any order or technical meaning. The terms “connected”, “coupled” and the like here include direct and indirect connections (coupling) unless otherwise specified.

The upper and lower positional relationships in this specification are relative and do not have absolute significance.

A solar energy utilization unit provided in an embodiment of the present disclosure can be configured to receive and utilize sunlight for energy conversation, including converting the sunlight into electrical, thermal and other forms of energy for use.

Please refer to FIGS. 1-4. The solar energy utilization unit C in the embodiment may include a light energy utilization means 100, a convex liquid light-concentrating means 200, a first reflection formation 300 and a second reflection formation 400.

The light energy utilization means 100 may include a first light energy utilization part 110 and a second light energy utilization part 120 that are capable of receiving, converting and utilizing sunlight and are arranged oppositely. In an embodiment, the light energy utilization means 100 may be one or more of a double-sided photovoltaic panel, a photo-thermal utilization device, a device utilizing photoelectric and thermal energy, and a concentrated light energy utilization means. The photovoltaic panel generally refers to any device that directly converts light energy into electrical energy, including various semiconductor photovoltaic panels, photovoltaic thin films, quantum dot optoelectronic converter devices, etc. In other embodiments, the first light energy utilization part 110 and the second light energy utilization part 120 may also be of other forms of structures for the utilization conversion of solar light.

The convex liquid light-concentrating means 200 may have a holding cavity 201*a* filled with a transparent liquid 201. The holding cavity may have a sloped transparent convex sidewall 210, from which sunlight can be transmitted into the transparent liquid 201. The convex liquid light-concentrating means 200 having the sloped transparent convex sidewall 210 can adapt to incident light with larger deflection angles, which can be used not only to cope with the north-south regression deflection of sunlight, but also to cope with the east-west deflection of sunlight. In an embodiment, the transparent convex sidewall may be composed of a flat surface, a folded surface, a curved surface, or a combination thereof.

The light energy utilization means 100 may be arranged in the holding cavity, outside the holding cavity, or form as a wall of the holding cavity. The first light energy utilization part 110 may be faced towards the convex liquid light-concentrating means 200 or the transparent liquid 201. The sunlight in the holding cavity transmitted from the transparent liquid 201 to the transparent convex sidewall 210 can produce the phenomenon of total reflection, concentrating the sunlight onto the first light energy utilization part 110. The structure of the convex liquid light-concentrating means 200 may be configured such that the sunlight transmitted from the transparent liquid 201 to the transparent convex sidewall 210 can produce the phenomenon of total reflection (also known as total internal reflection), that is, all or most of the sunlight reflected to the transparent liquid 201 may not be transmitted from the transparent convex sidewall 210, instead, the sunlight may be continuously propagated in the convex liquid light-concentrating means 200 under the total reflection and ultimately concentrated onto the first light energy utilization part 110. That is, the transparent convex sidewall 210 may act as a refractor or a total reflector based on different incident angles and sources, with an ultimate target of directing light towards the first light energy utilization part 110 of the light energy utilization means 100.

In this embodiment, the transparent liquid 210 is used as a light-propagating medium, and the transparent convex sidewall 210 plays a role in both light transmission and total reflection. Compared with the prior art, under the same conditions, the convex liquid light-concentrating means 200 can collect more sunlight to the first light energy utilization part 110, increasing the concentrating ratio thereof. Meanwhile, compared to the light energy utilization means 100, the incident angle of the light fully reflected can be improved, thus reducing the loss of reflection of the light energy utilization means 100 and enhancing the efficiency of utilization of light energy.

At the same time, in order to concentrate more sunlight to the convex liquid light-concentrating means 200, the first reflection formation 300 may be arranged on the outer side of the convex liquid light-concentrating means 200, such as arranged around the convex liquid light-concentrating means 200 or on one or more sides thereof. The first reflection formation 300 may have a reflective surface that can reflect sunlight to the convex liquid light-concentrating means 200. The first reflection formation 300 may be provided with a first light inlet L1*a* for sunlight to enter. The first reflection formation 300 can increase the range of sunlight received by the convex liquid light-concentrating means 200 and can concentrate more sunlight to the convex liquid light-concentrating means 200. For example, the sunlight may be reflected by the first reflection formation 300 onto the transparent convex sidewall 210 of the convex liquid light-concentrating means 200 and ultimately directed to the first light energy utilization part 110.

In order to further improve the utilization of sunlight by the light energy utilization means 100, a second reflection formation 400 can be provided to concentrate more sunlight to the second light energy utilization part 120. The second reflection formation 400 may be arranged on the outer side of the first reflection formation 300. A light reflection cavity 400*a* provided with a second light inlet L2*a* for sunlight to enter the light reflection cavity can be formed by the first reflection formation 300, the second light energy utilization part 120 and the second reflection formation 400. The second reflection formation 400 can reflect the sunlight entering the light reflection cavity onto the second light energy utilization part 120. The second light inlet may be arranged on the outer side of the first reflection formation 300, for example, arranged around the first reflection formation 300, or arranged only on one or more sides of the first reflection formation 300, to receive sunlight shining thereon. Some sunlight outside the receiving range of the first reflection formation 300 and the convex liquid light-concentrating means 200 can be reflected to the second light energy utilization part 120 of the light energy utilization means 100 to improve the efficiency of light concentration of the light energy utilization means 100.

The arrangement of the first reflection formation 300 and the second reflection formation 400 can expand the receiving range of sunlight for the solar energy utilization unit C and can concentrate more sunlight onto the light energy utilization means 100. The reflective surfaces adopted in the first reflection formation 300 and the second reflection formation 400 may use a variety of structures capable of sunlight reflection, such as a reflective Fresnel lens, a reflector surface, and a highly reflective coating.

In some embodiments, the side of the first reflection formation 300 facing the second reflection formation 400 may also be provided with a reflective surface, thus facilitating the propagation of sunlight in the light reflection cavity and ultimately improving the efficiency of sunlight concentration on the second light energy utilization part.

The convex liquid light-concentrating means 200 may concentrate all or most of the transmitted sunlight onto the light energy utilization means 100. In order to receive the sunlight, the light energy utilization means 100 may be arranged on the outer side of the convex liquid light-concentrating means 200, and the first light energy utilization part 110 may be attached onto the convex liquid light-concentrating means 200 such that the sunlight in the convex liquid light-concentrating means 200 can be concentrated on the first light energy utilization part 110. Alternatively, the first light energy utilization part 110 may be directly arranged in the holding cavity, or the first light energy utilization part 110 may form part of the wall of the light-concentrating groove. Such arrangement mentioned above may be adopted between the second convex liquid light-concentrating means 200 described below and the second light energy utilization part 120.

In particular, in an embodiment, the convex liquid light-concentrating means 200 may have a transparent bottom wall 220 made of a transparent material. The first light energy utilization part 110 may be bonded to the outer side of the transparent bottom wall 220; for example, the first light energy utilization part 110 may be fixed to the outer side of the convex liquid light-concentrating means 200. In the convex liquid light-concentrating means 200, sunlight may be concentrated towards the first light energy utilization part 110 and directed into the first light energy utilization part 110.

In another embodiment, the light energy utilization means 100 may be directly immersed in the transparent liquid 201, and the first light energy utilization part 110 may be directly receive the sunlight transmitted from the transparent liquid 201.

In yet another embodiment, the first light energy utilization part 110 may be part of the convex liquid light-concentrating means 200, and the outer wall (a side surface for receiving sunlight) of the first light energy utilization part 110 may be directly or indirectly connected to the transparent convex sidewall 210 and formed as the bottom wall of the holding cavity.

Part or all of the space in the convex liquid light-concentrating means 200 (or the second convex liquid light-concentrating means 200) may be filled with the transparent liquid 201. Preferably, in an embodiment, the transparent liquid 201 may basically fill the entire holding cavity to obtain a better effect.

In an embodiment, the transparent liquid 201 may be deionized purified water, glycerin, alcohol, ethylene glycol, or a mixture thereof.

In addition, the transparent liquid 201 may also directly or indirectly form a heat transfer structure with the first light energy utilization part 110 and the second light energy utilization part 120, such that it plays a cooling or heat absorption role on the first light energy utilization part 110 and the second light energy utilization part 120, improving the utilization of light energy.

Further, refer to FIGS. 1-4, in an embodiment, there is a clearance between the first reflection formation 300 and the second reflection formation 400, which may form the second light inlet.

Further, refer to FIGS. 1-4, in a more specific embodiment, the second reflection formation 400 may be a groove-like structure in which the light energy utilization means 100, the convex liquid light-concentrating means 200 and the first reflection formation 300 are arranged. The groove-like structure may have an internal reflecting surface to reflect sunlight onto the second light utilization part 120.

Figure 4:
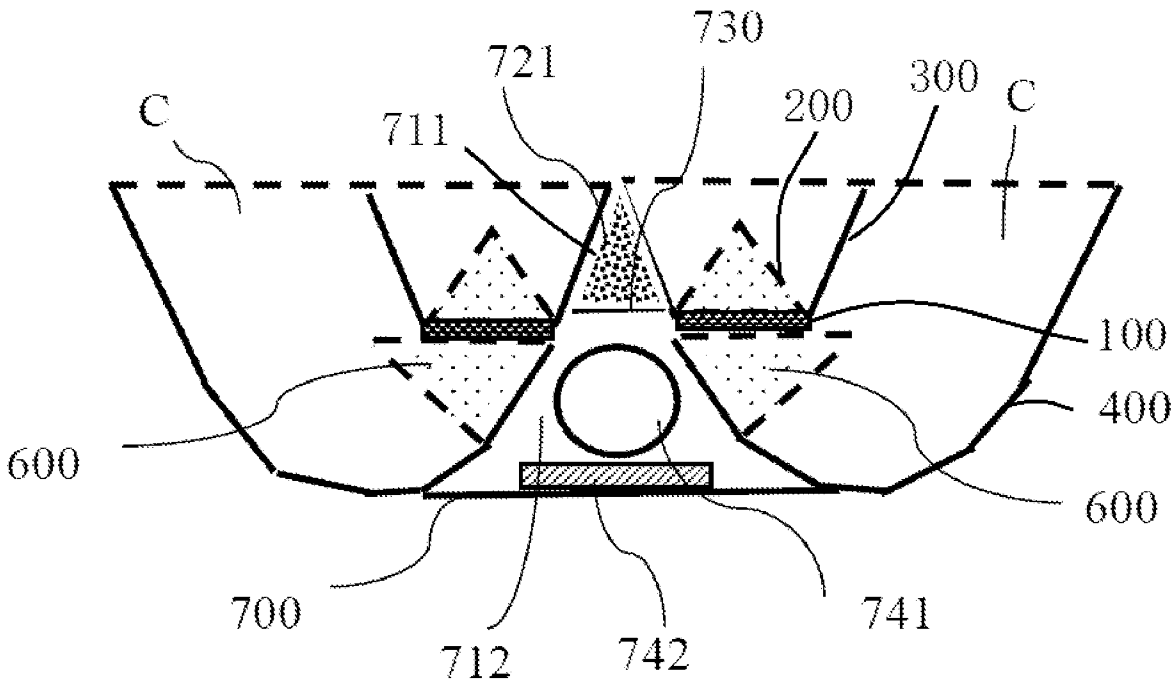
FIG. 4 is a schematic diagram of the vertical cross-section of a combined structure of the solar energy utilization units in an embodiment of the present disclosure.

Further, refer to FIG. 1 and FIG. 4, in order to improve the light-concentrating efficiency of the second light energy utilization part 120, there may further include a second convex liquid light-concentrating means 600 in an embodiment. The second convex liquid light-concentrating means 600 may have a structure similar to that of the convex liquid light-concentrating means 200. The second convex liquid light-concentrating means 600 may be arranged in the light reflection cavity and be provided with a second holding cavity filled with the transparent liquid 201. The second holding cavity may have a second transparent convex sidewall 610 which is inclined downward and convex. The sunlight entering the light reflection cavity may be transmitted from the second transparent convex sidewall 610 to the transparent liquid 201. The light energy utilization means 100 may be arranged in the second holding cavity, outside the second holding cavity, or formed as a wall of the second holding cavity. The second light energy utilization part 120 may be faced towards the transparent liquid 201 in the second convex liquid light-concentrating means 600 or that in the second holding cavity. The second holding cavity may be formed as a structure capable of allowing at least part of the sunlight transmitted from the transparent liquid 201 therein to the second transparent convex sidewall 610 to produce the phenomenon of total reflection, so as to concentrate the sunlight onto the second light energy utilization part 120. Part of the second transparent convex sidewall 610 (the non-incident part, i.e. the side represented by the solid line 600 in FIG. 4) may also be a mirror or highly reflective coating so as to concentrate the incident light from the transparent convex sidewall 610 onto the second light energy utilization part 120 by mirror reflection or diffuse reflection. Similar to the structures of the convex liquid light-concentrating means 200 and the first light energy utilization part 110, the second convex liquid light-concentrating means 600 in this embodiment can concentrate the light entering the second convex liquid light-concentrating means 600 as much as possible onto the second light energy utilization part 120 by the total reflection, mirror reflection or diffuse reflection.

Figure 2:
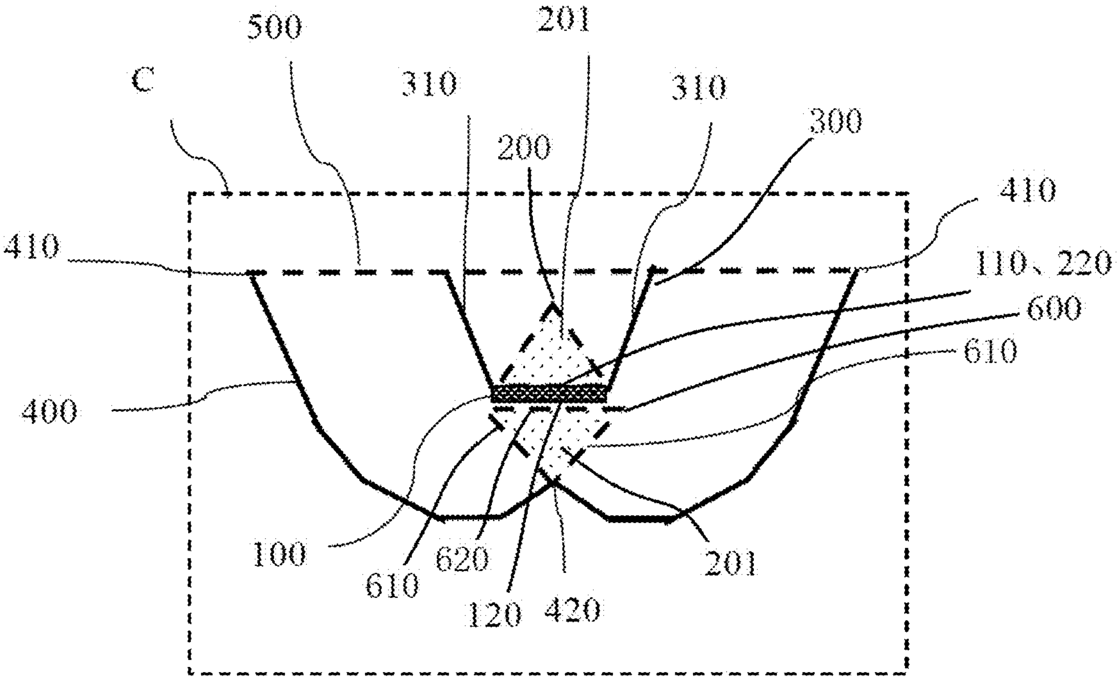
FIG. 2 is a schematic diagram of the vertical cross-section of a solar energy utilization unit in another embodiment of the present disclosure.

In an embodiment, refer to FIG. 2 and FIG. 4, the convex liquid light-concentrating means 200 may be arranged upwards in a sharp and protruding manner, and the second convex liquid light-concentrating means 600 may be arranged downwards in a sharp and protruding manner. In this way, more sunlight can be concentrated on the transparent convex sidewall 210 and the second transparent convex sidewall 610.

In an embodiment, refer to FIG. 2 and FIG. 4, the vertical cross-section of the convex liquid light-concentrating means 200 may be triangular, and the vertical cross-section of the second convex liquid light-concentrating means 600 may be inverted triangular. Of course, such shape is only an example, and other raised shapes may be used.

In order to prevent dust and facilitate clarity, refer to FIGS. 1-4, in an embodiment, the unit may further include a transparent cover plate 500 which encloses the first reflection formation 300 and the second reflection formation 400 to form a closed structure. The transparent cover plate 500 may be a Fresnel lens surface or other transparent structure.

Based on the above inventive concept, several different embodiments are further described below to better illustrate the inventive concept.

Example 1

Please refer to FIG. 1, a solar energy utilization unit C is disclosed in this embodiment. FIG. 1 schematically shows a vertical cross-sectional diagram of the solar energy utilization unit C. The vertical and horizontal directions mentioned in this and other embodiments are based on the placement direction shown in the figures. Due to the fact that the solar energy utilization device may be adjusted its direction based on terrain and latitude according to actual application, the placement direction in the figures may be different from that of the solar energy utilization device in actual application.

The solar energy utilization unit C may include a light energy utilization means 100, the convex liquid light-concentrating means 200, a first reflection formation 300 and a second reflection formation 400. The convex liquid light-concentrating means 200 may be a closed structure, forming a closed holding cavity filled with transparent liquid 201. The convex liquid light-concentrating means 200 may have a transparent convex sidewall 210. The dashed line in the figure indicates that the transparent convex sidewall 210 is a transparent surface.

The light energy utilization means 100 may be arranged beneath the convex liquid light-concentrating means 200 and may have a first light energy utilization part 110 faced upwards and a second light energy utilization part 120 faced downwards that are configured to receive, convert and utilize sunlight. The first light energy utilization part 110 may be bonded to the transparent bottom wall 220 of the convex liquid light-concentrating means 200, such that sunlight can be transmitted through the transparent bottom wall 220 to the first light energy utilization part 110. The transparent bottom wall 220 is closely attached to the first light energy utilization part 110, so they are illustrated together in the figure.

Of course, in other embodiments, the first light energy utilization part 110 of the light energy utilization means 100 may also be used as the bottom wall of the convex liquid light-concentrating means 200, so that there is no need to provide the transparent bottom wall 220 additionally. Alternatively, the first light energy utilization part 110 of the light energy utilization means 100 may also be arranged in the holding cavity of the convex liquid light-concentrating means 200.

Please refer to FIG. 1, in the embodiment, the first reflection formation 300 may have at least two reflectors 310 distributed on both sides of the convex liquid light-concentrating means 200, and each reflector 310 may have a reflective surface on one side facing the convex liquid light-concentrating means 200. The reflectors 310 may be connected to the convex liquid light-concentrating means 200 or the light energy utilization means 100 to form a cavity with a larger upper part and a small lower part, allowing sunlight to enter the cavity.

In a more specific embodiment, the reflectors 310 may be arranged symmetrically on both sides of the convex liquid light-concentrating means 200, and the axis of symmetry thereof may be the central axis of the convex liquid light-concentrating means 200 in the vertical cross-section. Of course, the reflectors 310 may be arranged symmetrically or asymmetrically on one or more sides of the convex liquid light-concentrating means 200. The purpose of such arrangement is to expand the range of sunlight reception and more sunlight absorption of the convex liquid light-concentrating means 200.

The second reflection formation 400 may be arranged at the outer side of the first reflection formation 300; and the first reflection formation 300, the second light energy utilization part 120 and the second reflection formation 400 may form a light reflection cavity having a second light inlet which is configured for allowing sunlight to enter the light reflection cavity. The second reflection formation 400 may reflect the sunlight entering the light reflection cavity onto the second light energy utilization part 120. Specifically, there may be a clearance between the first reflection formation 300 and the second reflection formation 400, forming the second light inlet.

Please continue to FIG. 1, in a more specific embodiment, the second reflection formation 400 may be a groove-like structure which has an internal reflecting surface for reflecting sunlight onto the second light energy utilization part 120. One sidewall of the groove-like structure may be overlapped with the first reflection formation 300, and the other sidewall of the groove-like structure may be separated from the first reflection formation 300. For example, the right side wall of the second reflection formation 400 in the figure may be overlapped with or connected to the right side of the reflector 310 in the figure, and the left side wall may be separated from the left of reflector 310 to leave space for sunlight to enter.

FIG. 1 shows the convergence of incident light L1 and L2. A first type may involve a process in which the incident light L1 is reflected by the reflector 310, refracted by the convex liquid light-concentrating means 200, and fully reflected by the convex liquid light-concentrating means 200 to the first light energy utilization part 110; that is, making full use of the total reflection of the transparent liquid 201 in the convex liquid light-concentrating means 200 to achieve concentration. Meanwhile, the transparent liquid 201 may also be used to cool or absorb heat for the light energy utilization means 100 to improve the utilization of light energy of the light energy utilization means 100. In other words, the transparent convex sidewall 210 may have two functions at the same time: first transmitting the incident light from the outside through a surface and then fully reflecting the light from the transparent liquid 201 through a surface. A second type may involve a process in which the incident light L2 is reflected by a side of the second reflection formation 400, and then reflected by the bottom of the second reflection formation 400 onto the second light energy utilization part 120.

In order to extend and expand the range of sunlight received by the entire unit, in an embodiment, the light energy utilization means 100, the convex liquid light-concentrating means 200, the first reflection formation 300 and the second reflection formation 400 may be extended in the same direction (that is, the horizontal direction perpendicular to the plane of the diagram shown in FIG. 1), forming a strip-like structure. FIG. 1 shows a vertical cross-section at a point in its extension direction. Of course, the unit may also be designed as a neat structure, for example, the vertical cross-section at any point in the extension direction of the unit may be the shape shown in FIG. 1.

In order to prevent dust and facilitate clarity, refer to FIGS. 1-4, in an embodiment, the unit may further include a transparent cover plate 500 which encloses the first reflection formation 300 and the second reflection formation 400 to form a closed structure. The transparent cover plate 500 may be a Fresnel lens surface or other transparent structure.

This embodiment can be used in scene where light has a strong angular tendency; for example, it can be mounted vertically or horizontally at high latitudes.

Example 2

Please refer to FIG. 2, a solar energy utilization unit C is disclosed in this embodiment. FIG. 2 schematically shows a vertical cross-sectional diagram of the solar energy utilization unit C.

The solar energy utilization unit C may include a light energy utilization means 100, a convex liquid light-concentrating means 200, a first reflection formation 300, a second reflection formation 400 and a second convex liquid light-concentrating means 600. The convex liquid light-concentrating means 200 may be a closed structure, forming a closed holding cavity filled with a transparent liquid 201. The convex liquid light-concentrating means 200 may have a transparent convex sidewall 210.

One of the differences between this embodiment and Example 1 is that a second convex liquid light-concentrating means 600 arranged in the light reflection cavity is provided. Similar to the convex liquid light-concentrating means 200, the second convex liquid light-concentrating means 600 may have a second holding cavity filled with a transparent liquid (which is the same or different from the transparent liquid in the convex liquid light-concentrating means 200). The second holding cavity may have a second transparent convex sidewall 610 arranged downwards, obliquely and protruding, such that the sunlight entering the light reflection cavity can be transmitted from the second transparent convex sidewall 610 to the transparent liquid 201. The dashed lines in the figure represent that the transparent convex sidewall 210 and the second transparent convex sidewall 610 are transparent surfaces.

The light energy utilization means 100 may be arranged in the second holding cavity, outside the second holding cavity, or formed as a wall of the second holding cavity. The second light energy utilization part 120 may be faced towards the transparent liquid 201 in the second convex liquid light-concentrating means 600 or that in the second holding cavity. The second holding cavity can form a structure capable of allowing at least part of the sunlight transmitted from the transparent liquid 201 therein to the second transparent convex sidewall 610 to produce the phenomenon of total reflection, so as to concentrate the sunlight to the second light energy utilization part 120, thereby improving the efficiency of light concentration of the second light energy utilization part 120 and thermal energy storage or dissipation thereof.

The shape and structure of the convex liquid light-concentrating means 200 and that of the second convex liquid light-concentrating means 600 may be the same or different, so does the transparent liquid therein. In FIG. 2, the convex liquid light-concentrating means 200 and the second convex liquid light-concentrating means 600 are arranged upside down; for example, the convex liquid light-concentrating means 200 is arranged upwards in a sharp and protruding manner and the second convex liquid light-concentrating means 600 is arranged downwards in a sharp and protruding manner for better concentration.

The second light energy utilization part 120 may be arranged above a transparent top wall 620 of the second convex liquid light-concentrating means 600; or the light energy utilization means 100 may be directly served as the top wall of the second convex liquid light-concentrating means 600, thereby no transparent top wall 620 is needed. Alternatively, the second light energy utilization part 120 of the light energy utilization means 100 may also be arranged in the holding cavity of the second convex liquid light-concentrating means 600.

Please refer to FIG. 2, in an embodiment, the width of the transparent top wall 620 (where the left and right direction shown in the figure is the width direction) is greater than that of the second light energy utilization part 120, and the region of the transparent top wall 620 that exceeds the second light energy utilization part 120 may be used to receive sunlight. In other embodiments, the width of the transparent top wall 620 may also be equal to or less than the width of the second light energy utilization part 120.

Furthermore, please refer to FIG. 2, in the embodiment, the vertical cross-section of the convex liquid light-concentrating means 200 is triangular, and the vertical cross-section of the second convex liquid light-concentrating means 600 is an inverted triangular. Of course, in other embodiments, the convex liquid light-concentrating means 200 and the second convex liquid light-concentrating means 600 may also be of other shapes.

In addition, please refer to FIG. 2, in the vertical cross-section of this embodiment, the light energy utilization means 100, the convex liquid light-concentrating means 200, the first reflection formation 300, the second reflection formation 400 and the second convex liquid light-concentrating means 600 are symmetrical structures, with the axis of symmetry being the central axis of the convex liquid light-concentrating means 200 and the second convex liquid light-concentrating means 600. In other embodiments, the light energy utilization means 100, the convex liquid light-concentrating means 200, the first reflection formation 300, the second reflection formation 400 and the second convex liquid light-concentrating means 600 may also be asymmetric structures.

Furthermore, in order to extend and expand the range of sunlight received by the entire unit, in an embodiment, the light energy utilization means 100, the convex liquid light-concentrating means 200, the first reflection formation 300, the second reflection formation 400 and the second convex liquid light-concentrating means 600 may be extended in the same direction (that is, the horizontal direction perpendicular to the plane of the diagram shown in FIG. 2), forming a strip-like structure. FIG. 2 shows a vertical cross-section at a point in its extension direction. Of course, the unit may also be designed as a neat structure, for example, the vertical cross-section at any point in the extension direction of the unit may be the shape shown in FIG. 2.

On the other hand, the bottom of the second reflection formation 400 may be connected to the sharp and protruding portion of the second convex liquid light-concentrating means 600 to divide the light reflection cavity into at least two parts.

Specifically, please refer to FIG. 2, there are two 410 at a position (a point in the cross-section shown in FIG. 2, which is a line in the 3D structure) where the second reflection formation 400 connected with the transparent cover plate 500. In this case, the second reflection formation 400 and the inverted second convex liquid light-concentrating means 600 may be intersected, or they may be not intersected at 420, because the second reflection formation 400 and the transparent cover plate 500 have been already produced a closed structure by being connected at 410.

Example 3

A combined structure for applying the solar energy utilization unit C is shown in this embodiment. The combined structure may include at least two solar energy utilization units C in any of the above embodiments.

Figure 3:
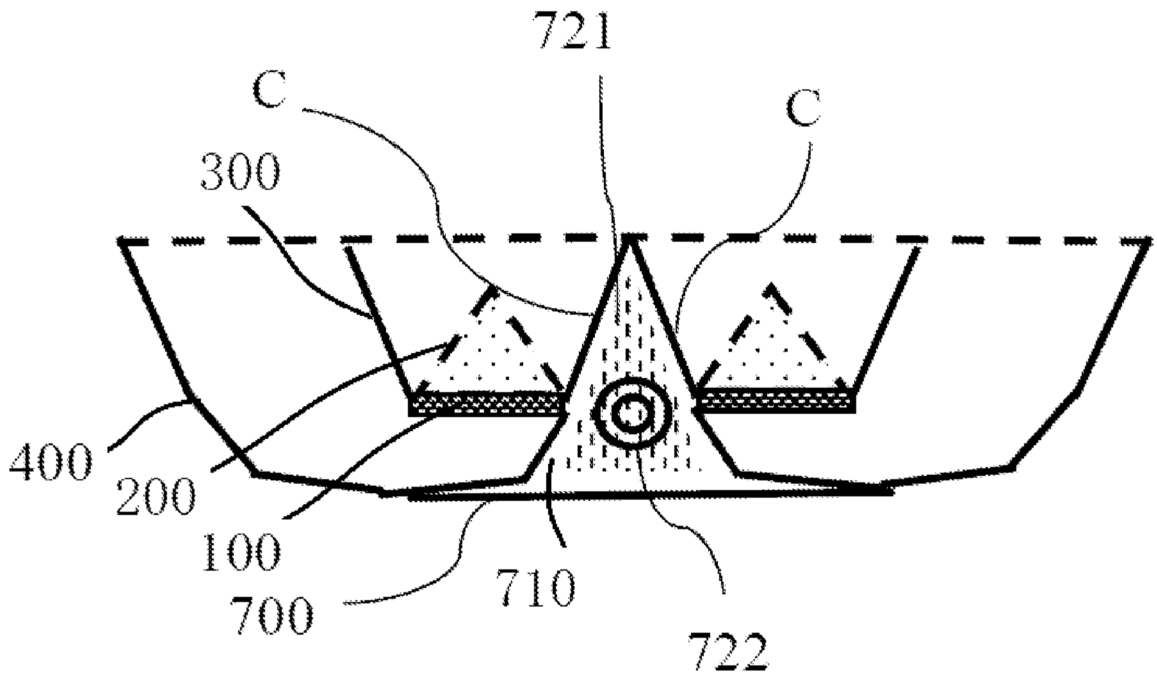
FIG. 3 is a schematic diagram of the vertical cross-section of a combined structure of the solar energy utilization units in an embodiment of the present disclosure.

Please refer to FIG. 3, the solar energy utilization units C are arranged side by side, and a cavity 710 is formed between the second reflection formation 400 of adjacent solar energy utilization units C. The cavity 710 is provided therein with a thermal utilization working medium 721 to transfer thermal energy.

Please refer to FIG. 3, in this embodiment, two solar energy utilization units C and C' are arranged symmetrically in a mirroring manner (which may also be arranged asymmetrically in other embodiments). The solar energy utilization unit C shown in Example 1 is taken as an example in this embodiment, but it can be understood that the solar energy utilization unit C may also be replaced by the solar energy utilization unit C shown in FIG. 2 or other solar energy utilization unit.

In this embodiment, two second reflection formations 400 are arranged on the outer side of two side-by-side solar energy utilization units C. In other embodiments, especially when more than two solar energy utilization units C are arranged side by side, some second reflection formations 400 may also be arranged on the inner side.

There is a cavity 710 between two solar energy utilization units C, which may be a region between two adjacent second reflection formation 400 or other structures. When sunlight shines, the cavity 710 is a high-temperature region, so it can be used for utilization of thermal energy.

In this embodiment, there is a cavity bottom 700 arranged at the bottom of the region between two solar energy utilization units C, which encloses the region between the two solar energy utilization units C into a cavity 710 filled with a thermal utilization working medium 721. The thermal utilization working medium 721 can be used for heat exchange with the outside through a pipeline 722.

In an embodiment, the thermal utilization working medium 721 is cold water. The combined structure of this embodiment can provide hot water for thermal energy utilization while generating electricity.

In other embodiments, batteries and other devices that require heat preservation in winter may also be placed in the cavity 710.

Example 4

A combined structure for applying the solar energy utilization unit C is shown in this embodiment. The combined structure may include at least two solar energy utilization units C in any of the above embodiments.

Please refer to FIG. 4, the combined structure disclosed in this embodiment may also include two solar energy utilization units C are arranged symmetrically in a mirroring manner (which may also be arranged asymmetrically in other embodiments). The solar energy utilization unit C shown in Example 2 is taken as an example in this embodiment, but it can be understood that the solar energy utilization unit C may also be replaced by the solar energy utilization unit C shown in FIG. 1 or other solar energy utilization unit.

There is also a cavity bottom 700 at the bottom of the region between two solar energy utilization units C. One difference from Example 3 is that the cavity 710 between the two solar energy utilization units C in this embodiment is divided into a first cavity 711 and a second cavity 712 (or more sub cavities) by an isolation wall 730. The thermal utilization working medium 721 is filled in the first cavity 711, and a charging battery 741 and a control circuit board provided with control and protection circuits and devices are separated into two parts in the second cavity 712.

In this embodiment, the area of the transparent top wall 620 of the inverted second convex liquid light-concentrating means 600 is greater than the area of the second light energy utilization part 120. In other embodiments, the area of the transparent top wall 620 of the second convex liquid light-concentrating means 600 may also be equal to or smaller than the area of the second light energy utilization part 120. In this embodiment, a portion of the transparent top wall 620 of the second convex liquid light-concentrating means 600 (the solid line portion of 600 in FIG. 4) mainly plays a reflective role, so this portion of the surface can be coated with a mirror or high reflective coating.

In this embodiment, the second reflection formation 400 may be coincided with a convex sidewall of the inverted second convex liquid light-concentrating means 600. For the solar energy utilization unit C, the convex sidewall is located outside, and for the combined structure, the convex sidewall is located inside. The overlapping part (the solid line part of 600 in FIG. 4) mainly plays a reflective role, so the surface of this part may be coated with a mirror or high reflective coating.

In this embodiment, there is an isolation wall 730 between the first cavity 711 and the second cavity 712. In other embodiments, the isolation wall 730 is not necessary, as long as the thermal utilization working medium 721 is enclosed in a packaging bag. The combined structure shown in this embodiment can be used in cold regions and insulate the battery.

The above specific examples are set forth to aid in understanding the present disclosure and are not intended to limit the present disclosure. Variations of those specific embodiments may become apparent to those skilled in the art in light of the teachings herein.

The invention claimed is:

1. A solar energy utilization unit, comprising:

a light energy utilization panel having a first light energy utilization part and a second light energy utilization part that are arranged oppositely and are capable of receiving, converting and utilizing light energy;

a convex liquid light-concentrating means having a holding cavity filled with a transparent liquid, the convex liquid light-concentrating means being arranged upward with a convex shape that narrows toward a point, the holding cavity being provided with a sloped transparent convex sidewall capable of transmitting sunlight therethrough to the transparent liquid, the light energy utilization panel being arranged inside the holding cavity, or outside the holding cavity or formed as a wall of the holding cavity, the first light energy utilization part being faced towards the convex liquid light-concentrating means or the transparent liquid, the holding cavity being formed as a structure capable of allowing at least part of the sunlight transmitted from the transparent liquid to the transparent convex sidewall to produce a phenomenon of total reflection, so as to concentrate the sunlight onto the first light energy utilization part;

a first reflection formation arranged on an outer side of the convex liquid light-concentrating means capable of reflecting sunlight to the convex liquid light-concentrating means, the first reflection formation being provided with a first light inlet for sunlight to access; and a second reflection formation arranged on an outer side of the first reflection formation, a light reflection cavity being formed among the first reflection formation, the second light energy utilization part and the second reflection formation, the light reflection cavity being provided with a second light inlet for sunlight to enter the light reflection cavity, and the second reflection formation reflecting sunlight entered into the light reflection cavity onto the second light energy utilization part.

2. The solar energy utilization unit according to claim 1, wherein there is a clearance forming the second light inlet between the first reflection formation and the second reflection formation.

3. The solar energy utilization unit according to claim 1, wherein the second reflection formation is a groove-like structure in which the light energy utilization panel, the convex liquid light-concentrating means and the first reflection formation are arranged, the groove-like structure having an internal reflecting surface to reflect sunlight onto the second light energy utilization part.

4. The solar energy utilization unit according to claim 3, wherein a sidewall of the groove-like structure overlaps with the first reflection formation, and another sidewall of the groove-like structure is separated from the first reflection formation.

5. The solar energy utilization unit according to claim 3, wherein the groove-like structure is formed with two sidewalls arranged oppositely, and both sidewalls of the groove-like structure are separated from the first reflection formation.

6. The solar energy utilization unit according to claim 1, further comprising:

a second convex liquid light-concentrating means arranged in the light reflection cavity and having a second holding cavity filled with a transparent liquid, wherein the second holding cavity has a second transparent convex sidewall in a downward sloped convex arrangement, the sunlight entering the light reflection cavity is allowed to be transmitted from the second transparent convex sidewall to the transparent liquid;

the light energy utilization panel is arranged inside the second holding cavity, outside the second holding cavity or forms a wall of the second holding cavity, the second light energy utilization part is faced towards the second convex liquid light-concentrating means or the transparent liquid in the second holding cavity, and the second holding cavity is formed as a structure capable of allowing at least part of the sunlight transmitted from the transparent liquid therein to the second transparent convex sidewall to produce the phenomenon of total reflection, mirror reflection or diffuse reflection, so as to concentrate the sunlight onto the second light energy utilization part.

7. The solar energy utilization unit according to claim 6, wherein the second convex liquid light-concentrating means is arranged downward with a convex shape that narrows toward a point.

8. The solar energy utilization unit according to claim 6, wherein a vertical cross-section of the convex liquid light-concentrating means is triangular, and a vertical cross-section of the second convex liquid light-concentrating means is inverted triangular.

9. The solar energy utilization unit according to claim 7, wherein a bottom of the second reflection formation is connected to a protruding portion of the second convex liquid light-concentrating means to divide the light reflection cavity into at least two parts.

10. The solar energy utilization unit according to claim 6, wherein the second convex liquid light-concentrating means is arranged beneath the second light energy utilization part.

11. The solar energy utilization unit according to claim 1, wherein the first reflection formation has at least two reflectors distributed on both sides of the convex liquid light-concentrating means, wherein one side of each reflector facing the convex liquid light-concentrating means is provided with a reflective surface, or both sides of each reflector are provided with reflective surfaces.

12. The solar energy utilization unit according to claim 11, wherein the reflectors are symmetrically arranged on both sides of the convex liquid light-concentrating means.

13. The solar energy utilization unit according to claim 1, further comprising a transparent cover plate enclosing the first reflection formation and the second reflection formation.

14. The solar energy utilization unit according to claim 1, the light energy utilization panel, the convex liquid light-concentrating means, the first reflection formation and the second reflection formation are extended in a same direction to form a strip-like structure.

15. A combined structure for solar energy utilization units, comprising at least two solar energy utilization units according to claim 1 arranged side by side, wherein a cavity provided with a thermal utilization working medium, a charging battery, and/or a control circuit board therein is formed between adjacent solar energy utilization units.

16. The combined structure according to claim 15, wherein the cavity is divided by an isolation wall into a first cavity filled with the thermal utilization working medium and a second cavity in which the charging battery and the control circuit board are arranged.

* * * * *